United States Patent [19]

Goel

[11] 4,207,538
[45] Jun. 10, 1980

[54] TEMPERATURE COMPENSATION CIRCUIT

[75] Inventor: Jitendra Goel, Kendall Park, N.J.

[73] Assignee: RCA Corporation, New York, N.Y.

[21] Appl. No.: 938,267

[22] Filed: Aug. 29, 1978

[51] Int. Cl.² .......................... H03F 1/30; H03F 3/16
[52] U.S. Cl. ..................................... 330/277; 330/289
[58] Field of Search .................. 330/277, 289; 331/66; 307/310

[56] References Cited

U.S. PATENT DOCUMENTS

| 3,050,644 | 8/1962 | Ironside | 330/289 X |
| 3,715,609 | 2/1973 | Hallen | 330/289 X |
| 4,011,518 | 3/1977 | Irvine et al. | 330/289 |

Primary Examiner—James B. Mullins
Attorney, Agent, or Firm—Samuel Cohen; Robert L. Troike; Raymond E. Smiley

[57] ABSTRACT

A positive temperature coefficient resistance element such as a sensistor and a negative coefficient resistance element such as a thermistor are arranged in a potential divider network, the output terminal of which produces a potential which is a function of temperature. The potential is applied as a bias potential to the control electrode of an amplifier circuit subject to variations in gain as a function of both control electrode voltage and temperature to reduce the gain, as a function of temperature, of the amplifier.

12 Claims, 6 Drawing Figures

TEMPERATURE COMPENSATION CIRCUIT

BACKGROUND OF THE INVENTION

Amplifying devices, and in particular solid state amplifying devices such as bipolar transistors and field effect transistors (FETs), are undesirably subject to changes in gain due to changes in environmental temperature. As an example, for gallium arsenide (GaAs) FETs peak drift velocity and carrier drift mobility in the material decrease with increasing temperature while the pinch off voltage increases with increasing temperature. As a result, an amplifier using GaAs FETs will undesirably increase in power gain as the temperature is decreased and decrease in power gain as the temperature is increased.

A number of temperature compensation techniques are known. U.S. Pat. No. 2,951,208, issued Aug. 30, 1960, to L. E. Barton, discloses a temperature sensitive diode in the bias network of a bipolar transistor amplifier circuit. A diode suitable for use with a bipolar transistor is inexpensive and for most applications provides adequate compensation. However, a diode suitable for use with a GaAs FET is relatively expensive.

It is also known to use a temperature sensitive resistance element having a negative coefficient of temperature, such as a thermistor, in a bias circuit. See for example, U.S. Pat. No. 3,264,571, issued Aug. 2, 1966 to J. D. Meindl, et al. Such an arrangement although inexpensive, does not allow for accurate temperature compensation over a wide temperature range.

SUMMARY OF THE INVENTION

Means having a positive temperature coefficient impedance and means having a negative temperature coefficient impedance are arranged in a potential divider network. The potential divider network is connected to the control electrode of an active device arranged in an amplifying circuit. The active device is subject to variations in gain due to variations in temperature and to variations in control electrode bias voltage. The potential divider network is arranged to provide a control voltage to the control electrode in a sense to oppose change in gain due to a change in temperature.

DETAILED DESCRIPTION OF THE PREFERRED EMBODIMENT

Figure 1:
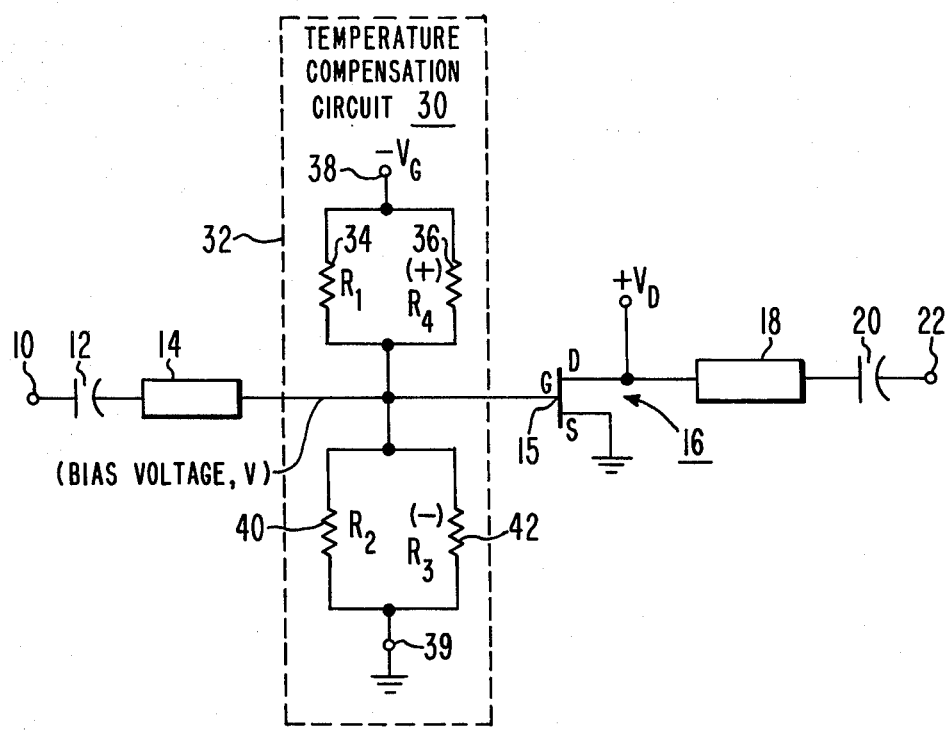
FIG. 1 is a schematic diagram of an amplifier circuit including a FET and employing a temperature compensation circuit in accordance with the present invention.

Refer to FIG. 1 which illustrates an amplifier circuit having an active element such as a field effect transistor (FET) useful for power amplification of microwave signals. An input terminal 10 is connected via decoupling capacitor 12 to a matching network 14. Matching network 14 is coupled to the control electrode or gate (G) electrode 15 of a FET 16. Matching network 14 matches the impedance applied to input terminal 10, typically 50 ohms, to that of the gate of FET 16.

The drain (D) and source (S) electrodes of FET 16 are connected to a source of potential ($+V_D$) providing an operating potential at the drain electrode. The drain electrode is also connected to a matching network 18. The matching network 18 is connected via a decoupling capacitor 20 to an output terminal 22 and matches the drain impedance of FET 16 to the impedance, typically 50 ohms, of a load connected at terminal 22.

Figure 2A:
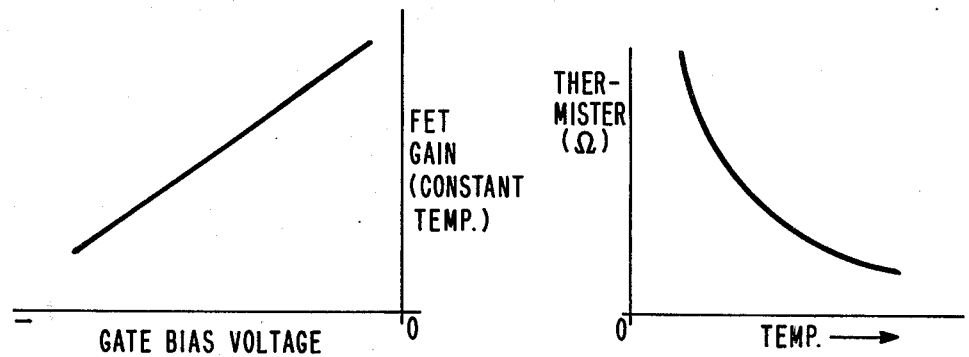
FIGS. 2a-2e are a set of waveforms useful in understanding the operation of the circuit of FIG. 1.
Figure 2D:
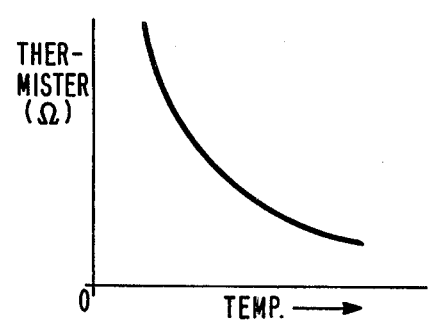
Figure 2B:
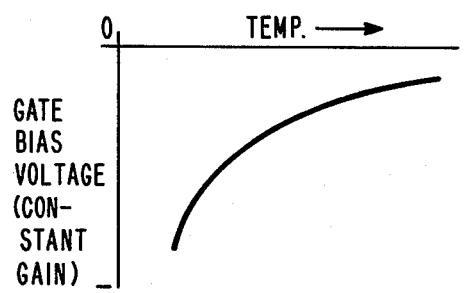

In the prior art, FET 16 is gate biased in a manner to provide a desired power gain or voltage gain depending on the application. See FIG. 2a which shows a linear waveform of gate bias voltage vs. FET gain at constant temperature. Undesirably the gain is also a function of the temperature of FET 16. As the temperature increases, the FET gain decreases; conversely as the temperature decreases the FET gain increases, as illustrated in FIG. 2c. Since the gain of the transistor is a function of bias voltage, by changing the bias voltage as a function of temperature, the gain of the FET as a function of temperature may be kept substantially constant.

A temperature compensation circuit 30 (FIG. 1) for changing bias voltage as a function of temperature is illustrated within dashed lines 32. This circuit is located in the same temperature environment as the temperature environment of FET 16. The temperature compensation circuit 30 comprises parallel-connected resistance elements 34 and 36 (also designated $R_1$ and $R_4$ respectively), series coupled between a first terminal 38 and the gate of FET 16. The parallel-combination of resistance elements 40 and 42 (also designated $R_2$ and $R_3$ respectively) is connected between the gate of FET 16 and a second terminal 39. The symbols (−) and (+) following resistance elements $R_3$ and $R_4$, respectively, denote that these elements are temperature sensitive as will be discussed below. Terminals 38 and 39 comprise means for connecting a source of bias potential, $-V_G$ to circuit 30. Elements 40 and 42 are connected to ground terminal 39 which is at the same potential as is the source terminal of FET 16, typically ground. The four elements (34, 36, 40 and 42) are arranged as a potential divider network to provide a temperature dependent portion or fraction of voltage $-V_G$ as a gate bias voltage to FET 16 as will be explained further.

Elements 34 and 36 ($R_1$ and $R_2$) are typical resistors which are substantially non-temperature dependent. Resistive element $R_3$ has the characteristic of decreasing in resistance as temperature increases, i.e. it has negative temperature coefficient as illustrated in FIG. 2d. Such an element, typically a thermistor, has a resistance which can be determined by the following formula:

$$R_3 = R_{To} \cdot e^{3900 \left[ \frac{1}{T} - \frac{1}{298} \right]} \tag{1}$$

where $R_{To}$ is the resistance at 25° C. and T is the ambient temperature in degrees C.

Figure 2E:
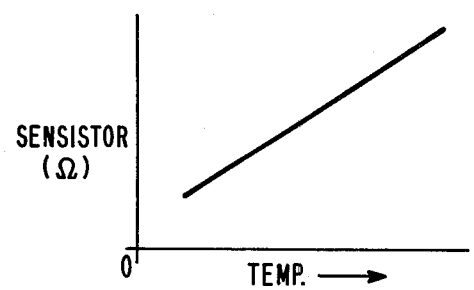
Figure 2C:
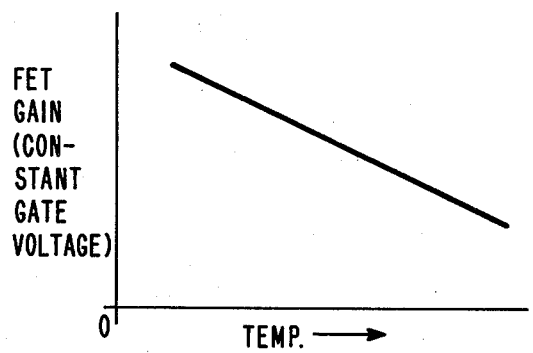

Element $R_4$ has the characteristic of increasing in resistance with increases in temperature, i.e., it has a positive temperature coefficient as illustrated in FIG. 2e. Such an element, typically a sensistor, has a resistance which can be determined by the following formula:

$$R_4 = R_{To}(0.8525 + 0.0059T) \tag{2}$$

Therefore the bias voltage (V) at the gate 15 of FET 16 may be represented by the following relationship:

$$V = -V_G \cdot \frac{[R_2 \| R_3]}{[R_2 \| R_3] + [R_1 \| R_4]} \quad (3)$$

where for example, $R_2 \| R_3$ represents the value of resistance of $R_2$ and $R_3$ in parallel. FIG. 2b illustrates the gate bias voltage (V) of FET 16 as a function of temperature of the FET required to produce a constant gain for signals applied to terminal 10. Note as seen in FIG. 2b that as the temperature increases the gate voltage (V) required to produce a given gain becomes less negative. Note further from FIG. 2a that as gate bias voltage becomes less negative, the gain at constant temperature increases, which gain counteracts the decrease in gain as temperature increases, as shown in FIG. 2c.

The values of $R_1$, $R_2$, $R_3$ and $R_4$ are determined by first producing a curve of the FET voltage 16 required to produce a given gain at various temperatures. Then the values of $R_1$, $R_2$, $R_3$ and $R_4$ may be computed empirically using different values of resistance to produce a voltage curve such as shown in FIG. 2b. This curve, it should be understood, offsets the change in gain due to temperature. Because both the positive and negative temperature coefficient resistance elements are present, the shape of the waveform, FIG. 2b, may be substantially changed as required to provide for temperature compensation.

Operation of the circuit of FIG. 1 will now be described with reference to the waveforms of FIG. 2. With nominal (room) temperature conditions, the gate of FET 16 is biased to produce a desired gain. As the circuit temperature increases due, for example, to power dissipation in the circuit, the gain of the circuit (in the absence of temperature compensation circuit 30) will decrease as illustrated in FIG. 2c. However, utilizing circuit 30, as the temperature increases, the resistance of $R_4$ increases while that of $R_3$ decreases, as illustrated in FIGS. 2d and 2e. As a result, the voltage, V, at the gate of FET 16, as computed from formula (3), becomes less negative (as illustrated in FIG. 2b) such that the gain of FET 16 remains constant. Conversely, if the temperature of the FIG. 1 circuit decreases, the resistance of $R_4$ decreases while the resistance of $R_3$ increases. As a result, the voltage of the gate of FET 16 becomes more negative maintaining constant gain.

In one working embodiment of FIG. 1 the resistance elements comprised:

$R_1 = 1.0K$ ohms
$R_2 = 1.5K$ ohms
$R_3 = 1.5K$ ohms
$R_4 = 1.0K$ ohms

Gain variations with this embodiment of the circuit did not exceed 0.8 dB from $-25°$ C. to $120°$ C. By contrast, with no temperature compensation, variations of 12 dB were noted over the same temperature range. It will be realized that depending upon the particular elements chosen for elements $R_3$ and $R_4$, resistors $R_1$ and/or $R_2$ may not be needed. Resistors $R_1$ and $R_2$ merely modify the temperature characteristics of the temperature sensitive elements. Thus for example, resistor $R_1$ changes the slope of the sensitor curve FIG. 2e by reducing the slope. If a sensitor with the desired slope is available, then resistor $R_1$ is not needed.

Temperature compensation circuit 30 may also be used with a dual gate FET. The circuit 30 is connected to the second gate, i.e., the gate physically closer to the FET drain. Temperature compensation circuit 30 may also be used with an amplifier circuit in which the gain increases with temperature. In such an amplifier circuit the position of the sensitor 36 and thermistor 42 of circuit 30 would be interchanged.

What is claimed is:

1. In an amplifier circuit which includes a field effect transistor having a gate electrode, wherein the gain of said transistor is a function of the temperature thereof and also a function of the amplitude of bias signal applied to said electrode, the improvement comprising in combination;

a potential divider network comprising the series connection of a first impedance means of the type which does not have a junction having an impedance value which is an inverse function of temperature, and second impedance means having an impedance value which is a direct function of temperature, each subject to the same temperature as said active element the junction of said first and second impedance means being coupled to said electrode; and means for connecting a source of bias potential to said potential divider network, said first and second impedance means being arranged to provide, at said junction, a signal which is a temperature dependant fraction of said bias potential, the value of said signal being matched to the gain of said field effect transistor as a function of temperature, said signal being applied to said electrode to alter the gain of said transistor in a sense to oppose the change in gain of said transistor due to changes in said temperature.

2. The combination as set forth in claim 1, wherein said first impedance means is a thermistor.

3. The combination as set forth in claim 1, wherein said second impedance means is a sensitor.

4. The combination as set forth in claim 1, wherein said first impedance means is a thermistor and wherein said second impedance means is a sensitor.

5. The combination as set forth in claim 4, wherein one terminal of said sensitor and one terminal of said thermistor are connected to said electrode and wherein the remaining terminal of said sensitor and remaining terminal of said thermistor are connected to said means to apply said source of bias potential.

6. The combination as set forth in claim 5, further including a non-temperature dependent resistance element coupled in parallel with said sensitor.

7. The combination as set forth in claim 5, further including a non-temperature dependent resistance element coupled in parallel with said thermistor.

8. The combination as set forth in claim 7, further including a non-temperature dependent resistance element coupled in parallel with said sensitor.

9. The combination as set forth in claim 1, wherein said active element is a gallium arsenide field effect transistor having a gain which is an inverse function of temperature.

10. In combination:
means for connecting a fixed potential between first and second terminals;
a field effect transistor having source, gate and drain electrodes, said source electrode being connected to the second terminal of said means for supplying fixed potential;
means for connecting an operating potential to said drain electrode of said field effect transistor; and potential divider means comprising;

first resistive means having a positive temperature coefficient resistance between first and second ends thereof, respectively, connected to the gate electrode of said FET and to the first terminal of said fixed potential; and second resistive means of the type which does not have a junction, having a negative temperature coefficient resistance between first and second ends thereof, respectively, connected to the gate electrode of said FET and to the second terminal of said fixed potential;

said potential divider means applying a portion of said fixed potential to the gate electrode of said field effect transistor for conditioning said field effect transistor to exhibit constant power gain, said portion of said fixed potential being dependent on the environmental temperature of said field effect transistor.

11. The combination as set forth in claim 10, wherein said second resistive means is a thermistor.

12. The combination as set forth in claim 11, further including a non-temperature dependent resistor in parallel with said first resistive means and a second non-temperature dependent resistor in parallel with said second resistive means for providing in combination with said first and second resistive means a temperature characteristic matching that of said field effect transistor.

* * * * *